United States Patent [19]
Carey et al.

[11] Patent Number: 5,656,139
[45] Date of Patent: Aug. 12, 1997

[54] ELECTROPLATING APPARATUS

[75] Inventors: Charles Francis Carey, Endicott; Kenneth Michael Fallon, Vestal; Voya Rista Markovich, Endwell; Douglas Oliver Powell, Endicott; Gary Paul Vlasak, Owego; Richard Stuart Zarr, Apalachin, all of N.Y.

[73] Assignee: International Business Machines Corporation, Armonk, N.Y.

[21] Appl. No.: 585,819

[22] Filed: Jan. 16, 1996

Related U.S. Application Data

[62] Division of Ser. No. 387,686, Feb. 13, 1995, Pat. No. 5,597,469.

[51] Int. Cl.$^6$ .......................... C25D 17/00; C25D 21/10
[52] U.S. Cl. ............................................. 204/222; 204/273
[58] Field of Search .................................... 204/222, 273, 204/275; 205/146

[56] References Cited

U.S. PATENT DOCUMENTS

| | | | |
|---|---|---|---|
| 3,275,542 | 9/1966 | Couture | 204/222 |
| 3,397,126 | 8/1968 | Gilbert | 204/222 X |
| 3,503,856 | 3/1970 | Blackmore | 204/273 X |
| 3,652,442 | 3/1972 | Powers et al. | 204/273 |
| 4,443,304 | 4/1984 | Eidschun | 205/146 |
| 4,459,183 | 7/1984 | Brady et al. | 204/273 |
| 4,686,014 | 8/1987 | Pellegrino et al. | 205/146 X |
| 5,316,788 | 5/1994 | Dibble et al. | 427/98 |

FOREIGN PATENT DOCUMENTS

| | | |
|---|---|---|
| 0618757A1 | 10/1994 | Germany. |
| 1196196 | 8/1989 | Japan. |

OTHER PUBLICATIONS

"Solder Bump–Making Process" IBM Technical Disclosure Bulletin vol. 32, No. 3B, Aug. 1989, New York, pp. 36–37.
"Solder Bump Formation on Via Holes" IBM Technical Disclosure Bulletin vol. 37, No. 6B, Jun. 1994, New York, pp. 299–300.

*Primary Examiner*—Donald R. Valentine
*Attorney, Agent, or Firm*—Whitham, Curtis, Whitham & McGinn; Michael E. Belk

[57] ABSTRACT

Small, closely spaced deposits of solder materials may be formed with high volumetric accuracy and uniformity of shape by depositing a layer of conductive material over surfaces of a dielectric layer having apertures or recesses (e.g. blind apertures) and conductors and/or pads exposed by those apertures or recesses, masking regions of the conductive material with a further patterned dielectric layer, electroplating solder materials onto regions of the conductive material exposed by the mask, removing the mask and portions of the conductive material by selective etching and reflowing solder away from at least a portion of the surfaces of the apertured dielectric layer. Uniformity of electroplating within blind apertures is enhanced by a combination of fluid jet sparging and cathode agitation. Excess conductor material in the resulting solder deposit can be avoided by replacing conductor material with a constituent component of a solder material in an immersion bath prior to electroplating.

6 Claims, 5 Drawing Sheets

ELECTROPLATING APPARATUS

This application is a divisional of application Ser. No. 08/387,686, filed on Feb. 13, 1995 now U.S. Pat. No. 5,597,469.

BACKGROUND OF THE INVENTION

1. Field of the Invention

The present invention generally relates to forming solder connections and, more particularly, to the formation of solder preforms on electronic circuit packages at small size and close spacing.

2. Description of the Prior Art

Soldering has been a familiar technique for forming electrical and/or mechanical connections between metal surfaces and is the technique of choice for many applications in the electronics industry. Many soldering techniques have therefore been developed for applying solder to surfaces or interfaces between metals to extend soldering techniques to many diverse applications.

In the electronics industry, in particular, the trend toward smaller sizes of components and higher integration densities of integrated circuits has necessitated techniques for application of solder to extremely small areas and in carefully controlled volumes to avoid solder bridging between conductors. One widely used technique, particularly for direct chip attachment to a board or module, sometimes referred to as "flip-chip" (or surface mount technology (SMT) as to the generic geometry of components), is the use of preforms such as so-called C4 preforms, possibly including a desired flux, for application to locations where solder connections are to be made. Such preforms have been highly successful for forming solder connections at small sizes and close spacings since the volume of solder contained in each preform is accurately controllable. However, the minimum size of such preforms is limited to sizes which can be efficiently handled by automated equipment and does not answer current needs for many electronic package manufacturing applications.

Another widely used technique is to provide pulverized solder material in a viscous binder in the form of a paste which can be applied by stenciling techniques. While this technique has been largely successful in providing application of solder to locations having sizes and spacings smaller than those where solder preforms can be used, the accuracy with which the dispensed volume of solder can be controlled is limited by the stenciling process due to the possibility of contamination, wear and damage to the stenciling masks through which the paste is extruded. Irregularities of solder paste distribution are also caused by the separation of the mask from the surface onto which the solder paste is stenciled. Also, the minimum size of particle of solder material which can be formed is limited by the process by which the particles are formed. That is, particles of smallest size are formed by atomization and solidification of liquid solder causing increase of the ratio of surface area to volume as size decreases, causing increase of oxide to metal volume for a fixed thickness of oxide on the surface of the particle and greater viscosity of the paste for a given metal loading of the paste with the particles. Lowering metal loading and viscosity, in turn, requires a thicker stencil to obtain the desired volume of metal with higher aspect ratio openings, contrary to the requirements of a stencil to accommodate small feature sizes since high aspect ratio stencil openings (and high viscosity) reduce the ability of the paste to release from the stencil. Thus, there is a trade-off between process complexities and requirements which limits the deposit size and stenciling resolution which can be achieved and control of the locations to which either the paste or the solder, itself, may flow.

Further, stenciling processes and the processes for fabrication of masks through which stenciling is done does not support the close spacing or fine pitch of solder connection locations which can be formed by lithographic technologies. Registration of the mask with connection locations also becomes difficult when close spacing of connections is required.

It is also known that, in the process of making a solder connection to a copper conductor, some copper is removed from the copper and becomes part of the solder connection material. This may become critical in some applications in microelectronic manufacturing, particularly in devices which are subjected to high temperature operation and thermal cycling, since tin-copper intermetallic compound precipitates may be formed. Further, the solubility of copper in typical solder materials is very small and on the order of 0.3%. Therefore, most excess copper in the solder materials will be in the form of such intermetallic compounds.

Small amounts of copper in the solder material also degrade the reflow characteristics of the solder. Specifically, when conductors are closely spaced, it is desirable that the solder tend to pull back toward the conductor on which the connection is made and away from adjacent conductors. This action also maximizes the conductive material in the connection and provides for a stable configuration of the solder material even when softened by normal or abnormal temperatures after the device is put into service. Such reflow characteristics may be entirely destroyed by very small copper content in the solder material.

Such reflow may also be adversely affected by small amounts of copper on the surrounding substrate, allowing such areas to be partially wetted or bridged. The only solution at the present time is to dissolve such copper deposits in the solder (which is difficult due to the low solubility of copper in solder materials, especially when the conductor also provides a source of copper solute in the solder material), react the copper from the solder with other materials or use aggressive fluxes. Any of these solutions require long reflow times and may compromise the integrity of the solder connection formed. Other materials, such as gold, are also known to have low solubility in solder and exhibit similar adverse effects on solder connections and reflow.

SUMMARY OF THE INVENTION

It is therefore an object of the present invention to provide a methodology for the deposition of solder materials capable of forming connections spaced as closely together as 225 μm with high uniformity.

It is another object of the invention to provide a technique of forming solder connections at sizes and spacings comparable to current lithography processes.

It is a further object of the invention to provide a technique of producing a solder connection at high resolution while providing reduced copper content in the completed connection.

It is yet another object of the invention to provide a method and apparatus for improving plating processes within recessed features of a surface.

It is another further object of the invention to provide a solder connection which will have a stable shape even at elevated temperatures.

In order to accomplish these and other objects of the invention, a method of forming a solder deposit is provided including the steps of electroplating solder materials onto portions of a conductive layer on at least surfaces of a first dielectric layer having apertures therein and exposed by apertures in a second dielectric layer, and reflowing solder materials away from a portion of surfaces of said first dielectric layer.

In accordance with another aspect of the invention, an electroplating apparatus is provided including an arrangement for directing a flow of electroplating fluid toward a conductive layer, and an arrangement for moving the conductive layer in a direction generally perpendicular to the flow of electroplating fluid.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
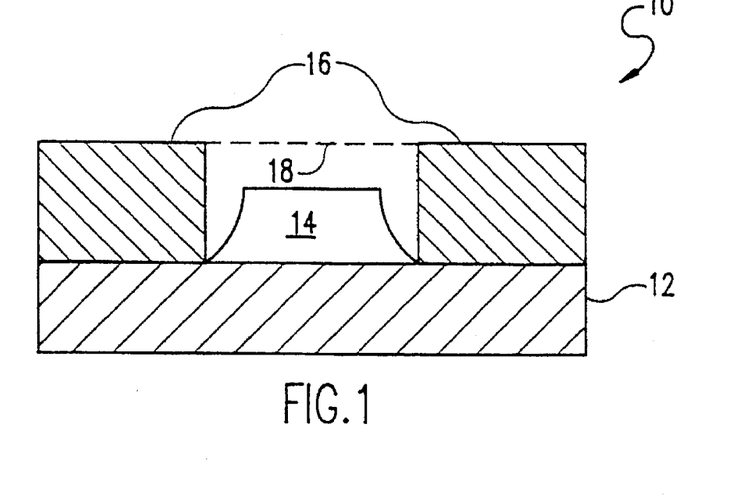
FIG. 1 is a cross-sectional view of an initial stage in forming a solder deposit in accordance with the invention.

Referring now to the drawings, and more particularly to FIG. 1, there is shown an initial stage 10 in the formation of a solder deposit in accordance with the invention. For simplicity and clarity of illustration, it is assumed that a conductor or pad 14 is simply supported on a planar substrate 12 but it is to be understood that layer 12 could be any layer of an integrated circuit or electronic package such as a so-called multi-layer module (MLM) capable of supporting and interconnecting a potentially large plurality of chips and that portions thereof could exhibit severe surface topography at other locations. Likewise it is to be understood that other conductors or pads could and normally would exist in close proximity to conductor or pad 14.

As further shown in FIG. 1, it is assumed that a layer 16 of material which is not wettable by solder has been applied and patterned (as indicated by dashed line 18), possibly by lithographic or other high resolution techniques, to remove material around the area where the solder connection is to be made. This patterned layer 16 thus surrounds the interconnection region and serves to prevent solder migration during the subsequent soldering and/or desoldering process or processes. Since this layer preferably remains in place for this purpose, thickness of the layer is not critical for defining the volume of solder deposited in accordance with the invention. However, as will be discussed in further detail below, it is desirable that layer 16 be relatively thin since increased thickness beyond that which produces a layer with good integrity (and a sufficient volume of solder to dissolve layer 20 as will be discussed below) has no beneficial result and may reduce the effectiveness and/or reliability with which some of the further processes in accordance with the invention may be performed.

It should be noted that the process of patterning layer 16 allows for some degree of misregistration and preferably does not require patterning at the minimum feature size in accordance with the design rules of the device since the openings in layer 16 are preferably somewhat larger than the feature size represented by the width of conductor or pad 14. However, this tolerance need not be provided and may be precluded by some designs in which the invention may be employed and registration tolerances would be correspondingly more critical.

Figure 2:
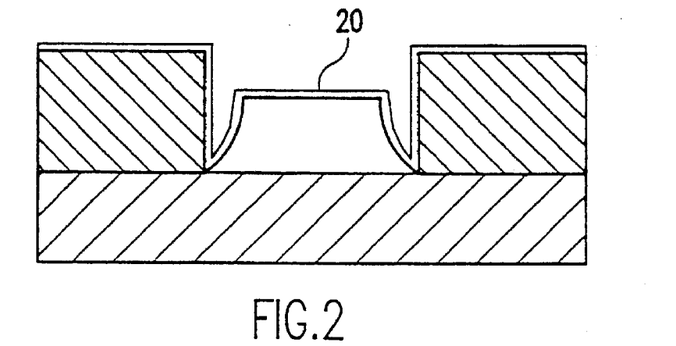
FIGS. 2, 3, 4 and 5 are cross-sectional views of intermediate stages of the formation of a solder deposit in accordance with the invention.

Referring now to FIG. 2, a solder-wettable, conductive layer 20 is deposited over all surfaces of the device, including those to which solder is to be applied. Known electroless plating processes and vacuum sputtering have been found suitable for depositing such a layer of copper. (While other materials such as gold, silver, noble metals and other conductive materials could be used in the practice of the invention, good conductors other than copper would be extremely expensive and less conductive materials would require a greater thickness of layer 20 with consequent complication of the process. Gold also has low solubility and forms gold/tin intermetallic compounds and thus would have only a very marginal advantage over copper even if cost were neglected.) Copper is generally preferred as such a solder-wettable material since copper has good adhesion, sufficient to the reliable practice of the invention, to most substrate and conductor materials and is low in cost.

To improve adhesion of conductive layer 20 which must support later-deposited layer 30 during the electroplating process, it is considered preferable to mechanically roughen (e.g. by pumice scrubbing) and/or chemically modify (e.g. with $O_2$ or $CF_4/O_2$ plasma or chemical treatment with alkaline permanganate or sulfuric-chromic acid solutions and the like) the surface of the solder mask to improve adhesion; the particular treatment being chosen to avoid damage to connections or pads of particular metals, such as gold.

Copper is also highly conductive and a relatively thin layer is sufficient for subsequent electroplating processes which will be described below. However, regardless of the material used for conductive layer 20, a sufficient thickness must be used to carry current for electroplating without causing a voltage gradient in the conductive layer 20 which would result in non-uniformity of deposition or heating which might damage the resist of the plating mask 30. If copper is used, it is somewhat critical that the layer 20 be kept as thin as possible due to the low solubility of copper in most solder materials, as discussed above.

Figure 3:
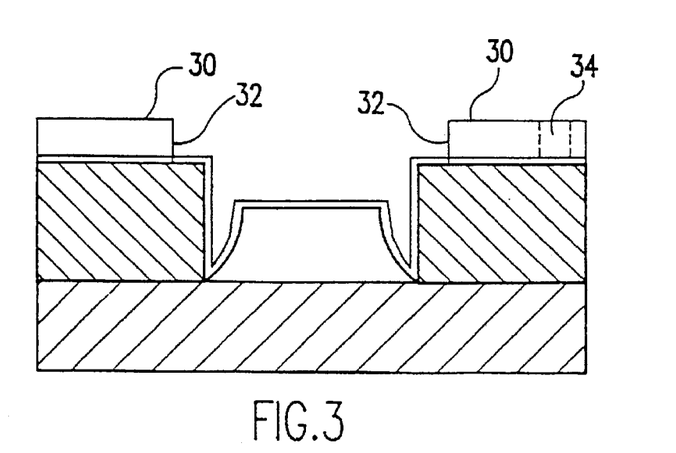

Then, as shown in FIG. 3, a patternable and removable dielectric layer 30 is formed over the solder-wettable layer 20 and patterned to form apertures preferably having a somewhat larger transverse dimension than the apertures in layer 16. The dielectric must be thick enough to contain the desired volume of solder material without "mushrooming" over the surface of layer 30 during plating. Dry film photoresists are particularly suitable for that reason. It is generally desirable to apply the dielectric layer 30 to both sides of the substrate to avoid deposition of solder on any exposed conductive surface other than those exposed by the patterning of layer 30. The transverse dimension of these apertures between aperture edges 32 should be chosen in accordance with the thickness of the layer 30 since the volume of the aperture defines the amount of solder material which will be deposited in accordance with the invention. By the same token, the larger transverse dimension provides a degree of registration tolerance in the patterning of layer 30. Additionally, increased depth of the aperture due to thickness of layer 30 may compromise later processes. Accordingly, it is desirable that the transverse dimensions of the apertures be as large as possible to maintain sufficient separation between them and the layer 30 be correspondingly thin and only of sufficient thickness to define a desired volume of solder materials. For flip-chip (DCA) applications, desired solder volumes are generally in the range of 40 to 70 cubic mils (0.000,000,040 to 0.000,000,070 cubic inches). A model for estimating required solder volumes is presented in "FLIP-Chip on FR-4 Integrated Circuit Packaging" by D. O. Powell and A. K. Trivedi, Proceedings of the 43rd Electronic Components and Technology Conference, IEEE, 1993 pp.182–186. Alternatively, solder volumes can be determined empirically.

It should be noted from FIG. 3 that the patterning of layer 30 exposes solder wettable material at all locations at which solder connections are to be made and that all exposed locations of layer 20 are electrically connected. At least one additional aperture 34 (schematically depicted by dashed lines) must also be formed for an electrical connection to layer 20, in order to carry out the processes illustrated in FIGS. 4 and 8.

Figure 4:
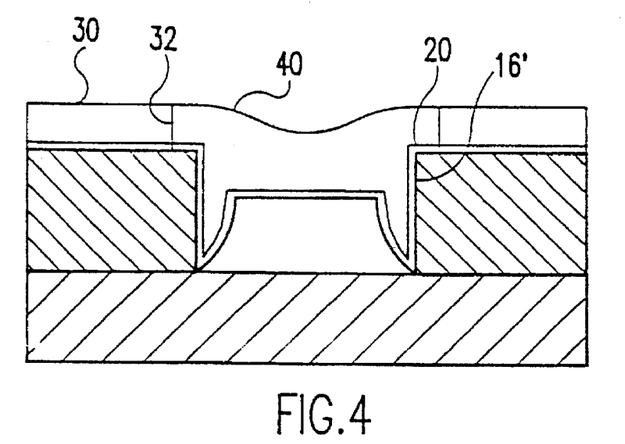

As shown in FIG. 4, metal solder material 40 is deposited on conductive layer 20 within. apertures defined by apertures 32 and 16' by electroplating. The metal solder materials, preferably tin and lead, may be deposited in a plurality of layers by sequential electroplating processes and/or by alloy electroplating. Other alloys such as tin-bismuth and lead indium and other combinations of electroplatable metals can be used. The electroplating process or processes are largely isotropic and thickness of the deposit is gradually built up from all conductor surfaces; thus allowing fine control of deposited solder volume within the volume coarsely defined by the apertures in both layers 16 and 30.

Figure 5:
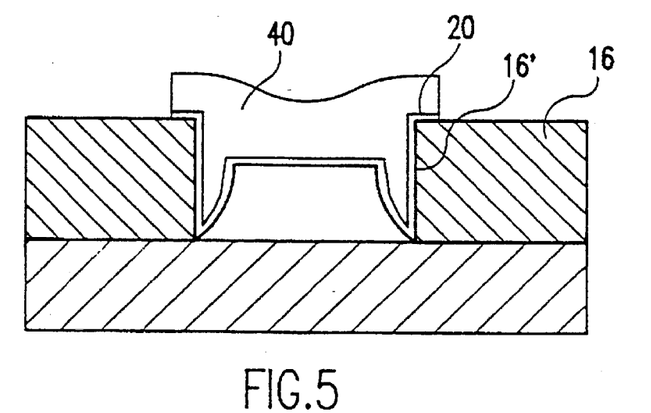

Then, as shown in FIG. 5, the dielectric layer 30 is removed and the portions of layer 20 which are not covered by the deposited solder material are selectively etched away using Selective etchants and processes well-understood in the art. The removal of these layers results in isolated lands of solder material but which are potentially slightly larger and possibly somewhat misregistered with the aperture 16'. Solder-wettable material of remaining portions of layer 20 also extend over a small region of the surface of layer 16 which, as indicated above, is intended to prevent solder migration during later soldering processes. Chemical treatment of the plated solder may optionally be done to remove contamination and residues from the stripping and etching processes.

Figure 6:
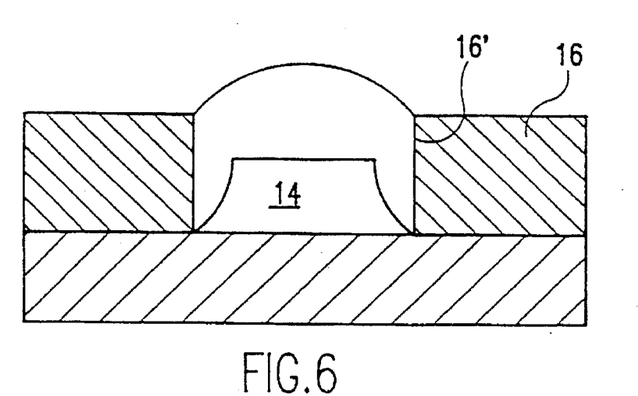
FIG. 6 is a cross-sectional view of the completed solder deposit in accordance with the invention.

Accordingly, as shown in FIG. 6, it is desirable to reflow the solder deposit prior to forming a solder connection. Application of heat to the device as shown in FIG. 5 sufficient to melt the solder material 40 causes the solder-wettable material of layer 20 to be dissolved in the solder material. At the same time, as the solder-wettable surface of layer 20 is destroyed, the surface of layer 16 which is not solder-wettable is exposed. This causes the solder material to withdraw from the surface of layer 16 to locations within the edges 16' of the apertures and for the shape of the solder material to become raised at a point centered within the aperture and over the pad or connection 14. Thus, minor misregistration of the patterning is corrected and transverse dimension of the deposit is reduced and an domed shape of the solder deposit (e.g. for self-registration with an aperture, application of flux and/or to make a contact centrally of an opposing pad to which a solder connection is to be made) is obtained. While such a domed shape may be desirable in many applications, however, some applications may require that the dome be flattened prior to forming a solder connection.

While the above-described process represents the most general methodology for practice of the invention, some minor variations are considered to be preferred for particular substrates and types of electronic packaging. Specifically, for printed circuit boards which are generally of polyimide or glass-epoxy materials with exposed copper connections, the copper connections are preferably covered with a solder mask 30 of non-solder-wettable material to control the areas on which solder is deposited. The solder mask 30 is preferably of an organic polymer film that can be patterned by stenciling or by lithography processes after application.

Aqueous processable solder resists are preferred since they exhibit a reduced tendency to leave residues in the apertures 16' which can interfere with plating and form inclusions in the solder. For applications which can benefit from "tenting" (e.g. bridging of the end of a plated through-hole which is useful, for example, where a plated through hole exists at a chip attachment location and where it is necessary to apply a reinforcing material as a low viscosity liquid to avoid fatigue of the solder joints and which would flow out of the plated through hole without closure of the hole by such tenting) of plated through holes in the printed circuit board, a dry film solder resist which naturally tents the plated through holes is preferred over liquid resist materials which do not. Non-solder wettable metal films, such as chromium, can also be used since differential etch rates between chromium and copper and solder materials can be achieved by known processes and etchants. Aluminum is also non-solder wettable and thus also potentially useful. These variations of the invention are also appropriate for MLM's using a polyimide for the substrate of a layer to which solder is to be applied, molded circuit boards and metallized ceramic substrates. Additionally, with metallized ceramic substrates, layer 16 can be formed as a thick film dielectric and patterned by stenciling.

For flex circuits where the substrate is a flexible polyimide or acrylic resin but which are otherwise similar to printed circuit boards, a flexible dielectric, preferably of similar material should be used for layer 16. However, solder mask materials similar to those used in printed circuit boards are satisfactory since flexure is not necessary during manufacture.

For multi-layer ceramic modules (MLC) which are normally constituted of ceramic dielectrics such as aluminum oxide, beryllium oxide or glass ceramic materials with conductive patterns of copper, tungsten, molybdenum or other suitable metal, interlayer connections are characteristically made by conductor filled through holes known as vias. Since the material surrounding the vias is not solder-wettable, a solder mask need not be separately provided and the ceramic layer, itself, serves as a solder mask. If the via material is not solder-wettable, it can be made wettable by plating with a solder-wettable metal such as copper or gold.

The invention may be applied to other structures and using other materials as the conductive layer 20 and dielectric layer 30 based on the above examples. The conductive layer 20 must be conductive, have good adhesion to conductors (in the event not all of the conductive layer material can be dissolved), selectively removable in comparison to the solder materials and wettable by those materials. In addition, some degree of solubility of the conductive material is desirable in order to cause the solder to pull back into aperture 16' when the solder is fused and reflowed. The dielectric layer 30 (which inhibits plating thereon) can be any material which can be patterned, easily removable and can withstand the chemicals used in the electroplating process.

While the process described above is effective to produce solder deposits at very small sizes corresponding to lithographic feature sizes and with substantial process latitude and geometric tolerances, recent reductions in feature sizes which can be produced lithographically cause several aspects of the above process to become relatively critical, such as the reduction of registration tolerances described above but which can be answered by tighter tolerances and reduced process latitude. Other problems encountered at extremely small feature size and spacing may require some process variation.

Specifically, as apertures 16' and 32 become of very small transverse dimension aspect ratio of the apertures (e.g. depth to width) may become larger. Either small transverse dimensions or increased aspect ratio may impede fluid flow and circulation (e.g. convection) within the apertures during the electroplating process and transport of metal particles or ions occurs substantially only through diffusion. Without such circulation, the electroplating fluids in the aperture rapidly become depleted of the material being plated onto exposed portions of conductive layer 20 and the solder deposits may require extended processing and/or be unreliably formed. That is, control of plating rate of the solder material is effectively lost. Reduced plating rate also limits the electroplating current which can be used without evolution of hydrogen through electrolysis and further displace plating solutions from the surfaces on with deposition is desired. Voids observed in the plated layer(s), even when plating times are extended may be attributable to this mechanism, as well. Increase of the bulk concentration of the plated material in the solution to increase the concentration gradient and the diffusion rate but has also been found to have a detrimental effect on plating thickness and volume uniformity. For example, a plating bath having a metal content of 20–40 grams/liter gives good plating uniformity (although such metal content may be varied considerably for different types of acid, additives and the like). However, if the metal content is doubled or tripled (while other constituents of the bath composition remain generally unchanged) in order to significantly alter the concentration gradient, substantial reduction of plating uniformity will usually result.

Several agitation techniques are known which can marginally increase the concentration gradient, as well, but none have proven to be an effective correction for poor deposition uniformity in small apertures. For example, solution recirculation decreases the diffusion layer thickness and increases the concentration gradient by shear forces in the fluid. However, the limiting current is determined by the location of the lowest amount of shearing force (and lowest concentration gradient) in order to avoid evolution of hydrogen gas. The lowest amount of shearing force remains in the blind apertures. Further, localized variation in shear lead to localized differences in current density and plating thickness. Air sparging, which provides turbulence by blowing a gas, such as air, through the fluid has a similar action but suffers from loss of uniformity over large areas and the trapping of gas bubbles. Additionally, nitrogen must be used rather than air, at greatly increased cost, in the presence of divalent tin ions due to the high rate of oxidation thereof to the quadravalent state which precipitates out of the fluid bath. Therefore, control of tin concentration in the bath and the deposited layer or alloy is lost. Cathode agitation in the plane of the deposition surface produces increased uniformity over large areas but is not sufficiently effective in high aspect ratio blind apertures where shearing force remains low.

To avoid this problem, it has been found effective to use a combination of fluid jet agitation toward the deposition surface to produce turbulence at the deposition surface and cathode agitation in a plane generally perpendicular to the fluid flow. It is preferred to pump the plating fluid toward the deposition or plating surface through a plurality of small orifices in a manifold, known as a sparger, from a distance of a few inches. Minimum amplitude of cathode agitation in relation to the spacing of jet orifices in the manifold is preferably such that each point on the panel being plated is impinged by a jet stream within about 0.25 inches of directly opposite an orifice (e.g. an agitation stroke of about one-half inch less than orifice spacing in one or, preferably, both coordinate directions). Extension of the cathode agitation stroke appears to produce only marginal, if any, increase in plating uniformity and may require increase of tank size.

Figure 7A:
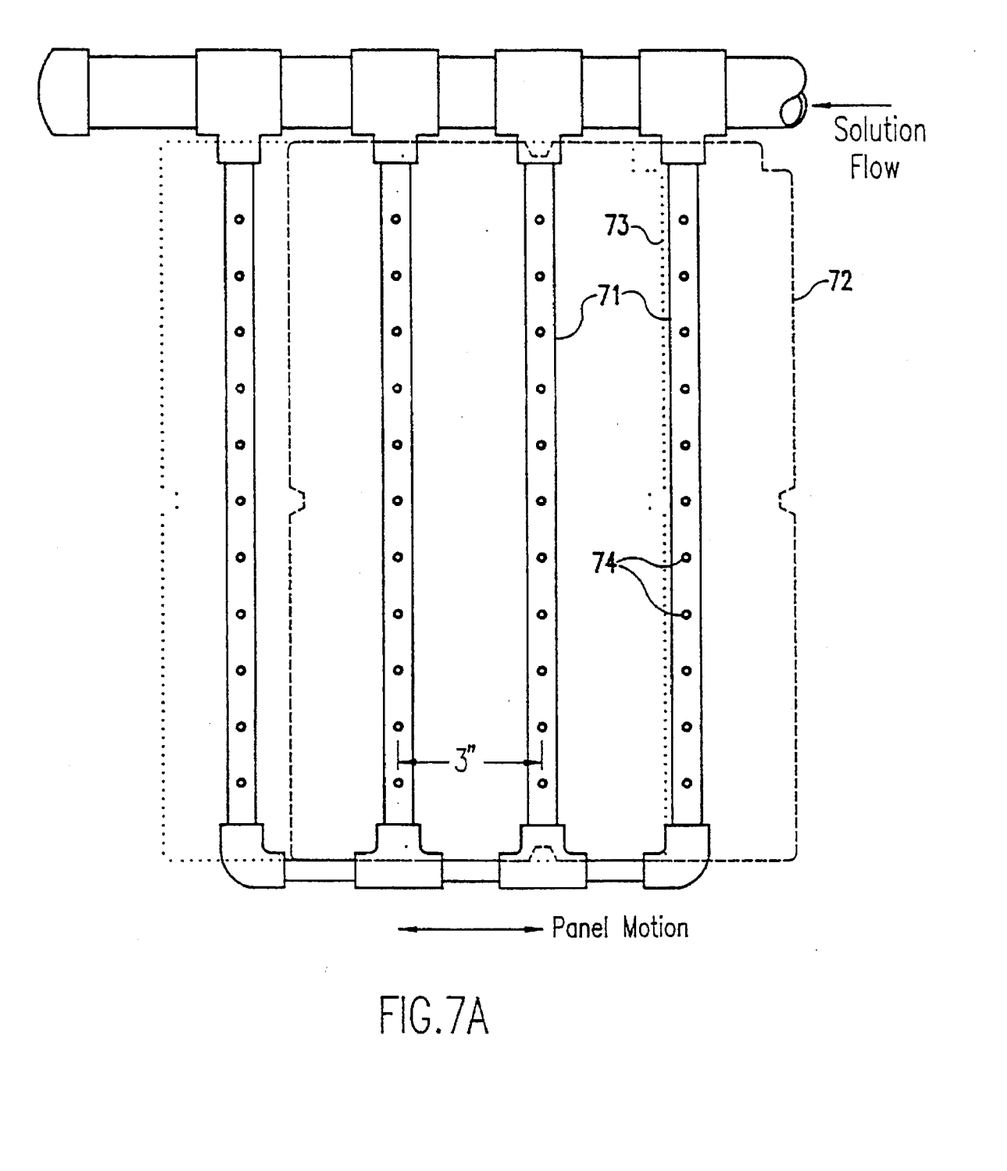
FIGS. 7A and 7B are front or elevation views of spargers in accordance with an aspect of the invention which may be used to advantage in the practice of the invention.
Figure 8:
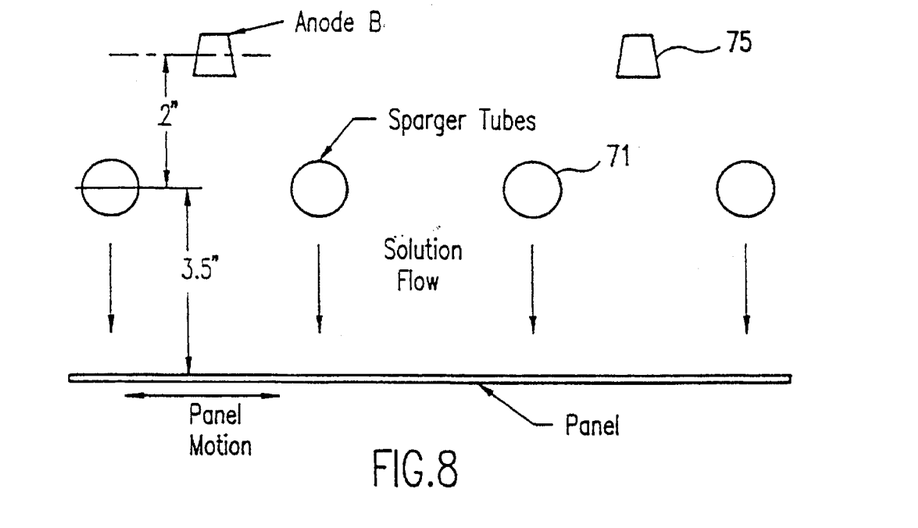
FIG. 8 is a diagram illustrating a preferred method of use of the sparger illustrated in FIG. 7.

An exemplary sparger is illustrated in FIG. 7A. In this case, the sparger size corresponds to a 10 inch by 15 inch panel outline and consists of four pipes 71 spaced three inches on center for a width of 12 inches, allowing for a 2.5 inch amplitude of panel motion for cathode agitation, shown by dashed and dotted lines 72, 73. Forty-four orifices 74 are provided, each having a diameter of one-eighth inch. FIG. 8 is a top view of this arrangement, including anode bars 75 spaced two inches behind the sparger which, in turn, is spaced at 3.5 inches from the panel surface.

This arrangement provides a stagnation point of the jets near the surface of the panel with a solution flow rate of 5–10 gallons per minute. This positioning of the stagnation point maximizes turbulence of the fluid at the surface of the panel. A higher flow rate of 15 gallons per minute yielded unacceptable erosion of deposits. That is, since the stagnation point would be effectively "behind" the panel at the higher flow rate, erosion appears to be due to excessive fluid velocity and fluid force against the panel.

Optimum cathode agitation using the arrangement of FIG. 8 was empirically determined to be 60–120 strokes per minute with a 2.5 inch stroke. This level of cathode agitation tends to optimally even out the localized variations in turbulence from the jets and provides a shearing action against the fluid which augments the effects of turbulence for providing circulation within the blind apertures. Further, using the arrangement of FIGS. 7A and 8, a current density of 15–25 amperes per square foot of plated area with a bath concentration of 14–40 grams per liter total metals (tin plus lead) and 250–350 grams per liter of free acid. This combination of conditions appears optimal from the standpoint of rapid material deposition while avoiding generation of hydrogen gas by electrolysis; providing good deposit uniformity and absence of voids, resulting in high production yield closely approaching 100%.

Figure 7B:
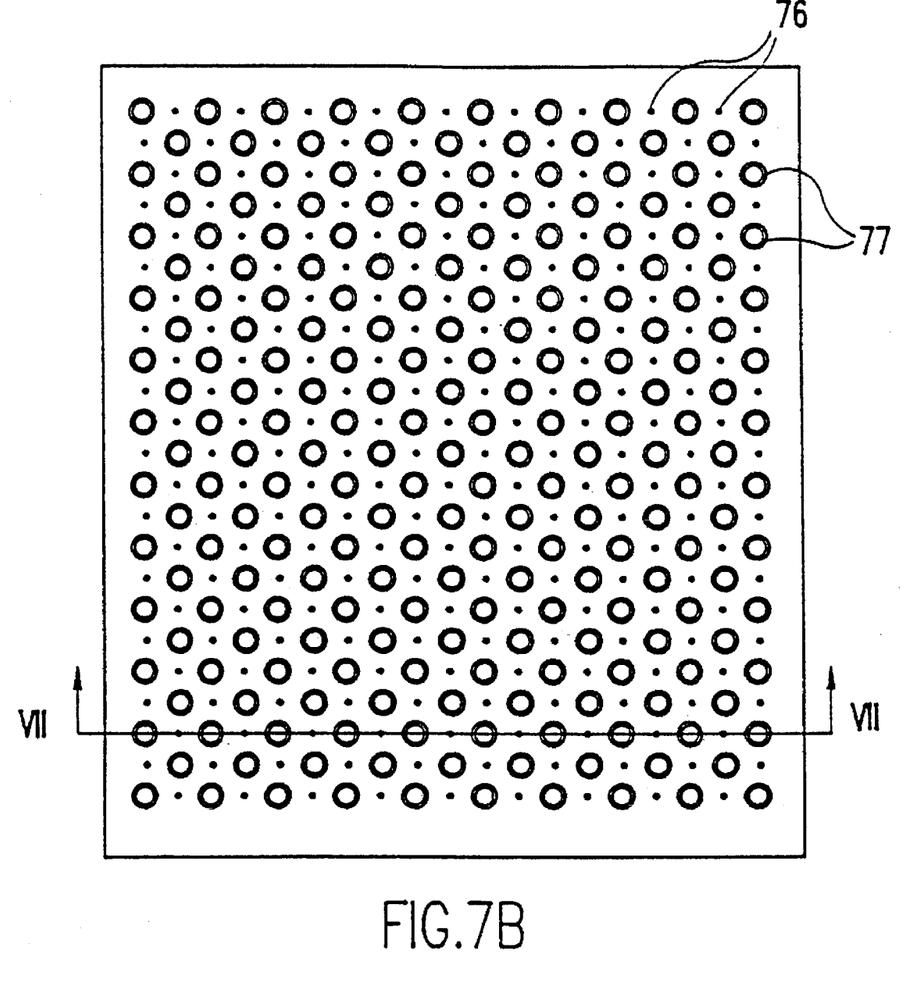
Figure 7C:
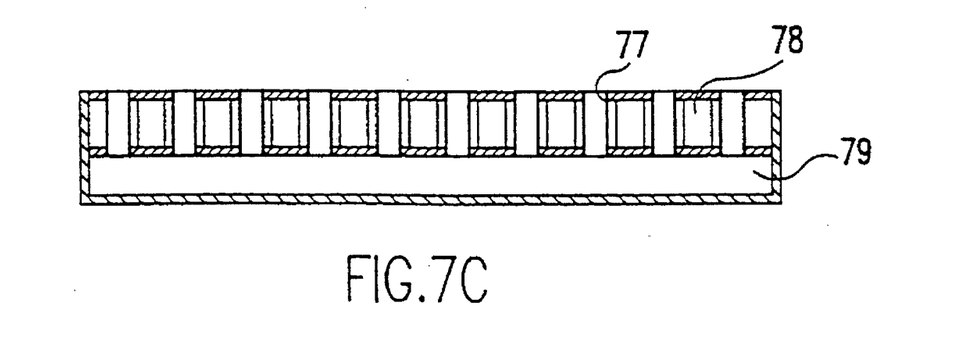
FIG. 7C is a top or plan view of the sparger of FIG. 7B.

A variation of the manifold of FIG. 7A is shown in FIG. 7B and 7C. As seen in FIG. 7B, the orifices 76 are smaller (e.g. 1/16 inch) and more numerous as well as being arranged in rows at 45° to the boundaries of the sparger at a closer spacing. This has been found to provide more uniform turbulence over the surface of the panel. The greater uniformity of turbulence does not require adjustment of cathode agitation stroke and closer spacing of jets effectively provides a higher frequency of local variation of turbulence at any point on the panel during the cathode agitation stroke. (Note that 4×0.75 inches equals the three inch spacing in the embodiment of FIG. 7B.)

Additionally, as shown in FIG. 7B, the alternative sparger includes a further array of relatively larger (e.g. 1/4 inch) openings 77 interspersed among the jet orifices 76 discussed above. These orifices are formed by tubes, as best shown in FIG. 7C, which communicate between the exterior of the sparger and a return plenum 79 located behind the source plenum 78 which supplies fluid to the jets 76. This array of return openings 77 substantially avoids the development of directionality in the average flow across the panel. Development of directionality of flow is cumulative across the panel over the distance from any jet to any return inlet and the effects are generally manifested as substantial changes in deposition thickness toward the panel edges if the return inlets are provided outside the panel area. Thus the arrangement of a return inlet between each pair of jets in both coordinate directions is highly effective in avoiding cumulative development of flow directionality across the panel.

It should be noted that the total area of the jet orifices in the embodiment of FIGS. 7B and 7C is comparable to that of the embodiment shown in FIG. 7A so that the flow rates and the geometry of the individual fluid jets is comparable. Therefore, similar plating bath concentrations and plating currents can be used with either sparger embodiment. The much greater area of the return openings 77 compared to the jet orifices 76 assure that little effect on the individual jets will be produced thereby.

A second problem encountered when the invention is applied to the formation of extremely small deposits at the present limit of lithographic technology is due to the reduced volume of solder materials available for dissolution of copper. That is, a reduction in transverse dimensions of a solder deposit will cause a much larger proportionate decrease in the volume of the solder deposit even if the thickness of layers 16 and 30 remains the same. While the surface area plated with copper will decrease somewhat, the volume of the solder will decrease far more and thus, for a given thickness of copper, the ratio of copper volume to solder volume will increase significantly as transverse dimension of the solder deposit is decreased. In practice, however, the thickness of the solder deposit defined by layers 16 and 30 will often be reduced as well, both to reduce the volume of solder which could form bridge connections to other conductors or pads as spacing is reduced and to hold the aspect ratio of blind apertures to a suitable value as transverse dimensions of the deposit are decreased.

As pointed out above, the solubility of copper in solder materials is very low and molten solder can be easily saturated with copper and copper-tin intermetallic compounds may be formed which precipitate from the solder material as the solder is cooled and may significantly affect the alloy composition and melting point of the solder.

As a best case simplification, if only the portion of the copper layer on the bottom of the blind apertures is considered (so that all volumes of metal are proportional to the relative thickness of each deposit) a 0.625 μm thick copper layer which must be dissolved into a solder deposit 25 μm thick yields a copper concentration of 2.5%, far in excess of the solubility of copper in the solder materials. The actual case becomes much worse when the volumes of copper deposited on the sidewalls of the blind apertures and the surface of layer 16 are considered; the latter being most critical to the geometry of solder reflow and which may be increased to increase the volume of solder deposit (although the volume of copper is disproportionately increased in this region because the thickness of solder is not as great as in other regions of the deposit). As alluded to above, the connection or pad 14 can also be a significant additional source of copper.

Figure 9:
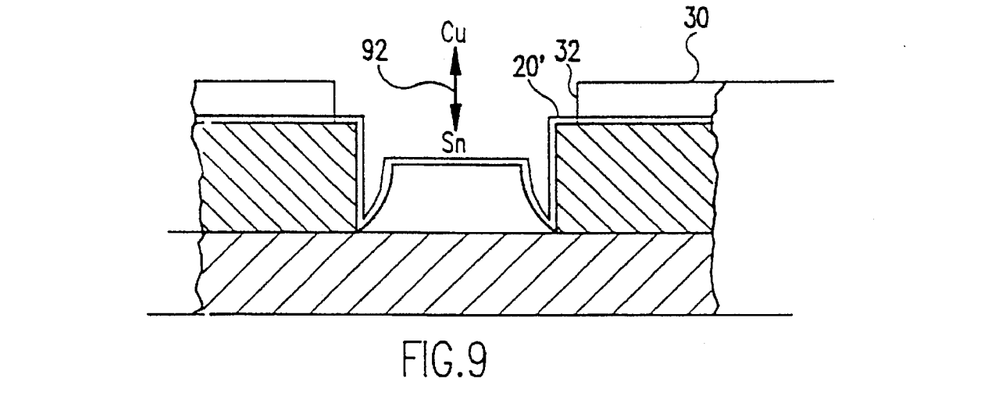
FIG. 9 is a cross-sectional view of a variation of the invention and the formation thereof which is preferably performed subsequent to the formation of the intermediate stage illustrated in FIG. 3.

In order to avoid this problem of excess copper in the solder material when the invention is applied to deposits of very small size, an additional step is provided in the methodology discussed above in regard to FIGS. 1–6. Specifically, as shown in FIG. 9, after layer 30 is applied and patterned as shown at 32, the device is treated in an immersion bath for a length of time sufficient for replacing substantially all the exposed copper in layer 20 with tin or other material which is a constituent of the intended solder alloy, as indicated by arrow 92, to form a deposit of solder constituent material 20'. That is, any remaining trace amount of copper for which the solder constituent material is not substituted should be less than the amount of copper that can be readily dissolved in the solder material. Thus, the timing of this process may be empirically determined. No replacement of copper occurs at unexposed locations of layer 20 and the resulting deposits of tin or other solder constituent material remain electrically connected to each other and the source of electroplating current with a highly conductive copper grid.

After replacement of the copper in this manner, the remainder of the process steps described above in regard to FIGS. 4–6 can be performed to complete the solder material deposit. The electroplating process proceeds precisely as before since the replacement metal remains electrically connected by a low resistance copper grid which can carry sufficient current for the purpose. Layer 30 can then be removed in precisely the same manner and the same selective etchants can-be used to selectively remove the remaining portions of copper layer 20 without attacking the solder deposits. The solder material can be reflowed and will draw back to the aperture 16' as described above since layer 16 is not solder-wettable but without the need to dissolve more than trace amounts of copper in the solder.

It should be noted that initially forming conductive layer 20 of tin does not provide satisfactory results, largely because of inherently lower adhesion of tin to layer 16 which tends to flake of and contaminate the surface. The adhesion is certainly insufficient to support layer 30 during electroplating. This lower adhesion cannot be avoided since layer 16 must be of a non-solder wettable material. Additionally, a greater thickness of tin or other material would be required to carry the electroplating current. This additional thickness, itself, presents a further complication since etchants effective to remove portions of layer 20 between the solder deposits after electroplating would also attack the solder deposits.

Suitable immersion baths for this purpose are known for use in manufacture of printed circuit boards but have been used only for the replacement of a thin surface layer of the copper. As to appropriate materials for replacement of copper, immersion baths containing tin, lead or a combination thereof are known and possible for the practice of the invention. Pure tin should be used for copper replacement if tin/bismuth solder materials are to be deposited. Otherwise, a tin/lead combination which closely matches the intended relative concentrations in the solder materials to be deposited will allow closest regulation of the melting point of the total solder deposit when the replacement material becomes mixed with the remainder of the solder material. Between pure tin and pure lead replacement materials, pure tin is preferred since variation of the tin content of solder has less effect on melting point of solder than a comparable variation in lead content.

In addition to avoiding the problem of excess copper in solder connections and the attendant problems with solder reflow, this variation of the invention is considered to be advantageous for several other reason, as well. For example, if copper is not replaced, as in the first-described methodology of the invention, two passes are required through an infra-red reflow oven, each followed by a deionized water cleaning step to obtain complete dewetting of the surface of the solder from the solder mask layer 16 and (especially where apertures 16' are large, relative to the dimensions of pad or connection 14, the surface of card dielectric layer or substrate 12) to obtain complete pull-back of the solder onto the circuit connections or pads 14. A mildly activated, water cleanable flux is also required for each of these reflows. This flux is incompatible with the formation of a solder connection and the final reflow cannot be combined with the formation of solder connections to an integrated circuit, module or board. Also, water cleaning processes are ineffective with the close spacings characteristic of direct chip attachment (DCA) geometries. Therefore, by the single metal replacement step, a plurality of time-consuming steps required for reflow are avoided.

Further, since dissolution of copper is not required, the flux used for reflow can be chosen from fluxes (e.g. non-activated, "no-clean" fluxes) suitable for making solder connections. Therefore, the connection of chips, modules and/or boards can be done concurrently with the reflow step, further reducing process steps and complexity. Also, as alluded to above, the rounded or domed upper surface of the solder deposit formed by the drawing back of solder during reflow may not be desirable in some applications, in which case, a further process step for flattening of the solder deposits is avoided, as well.

Figure 10:
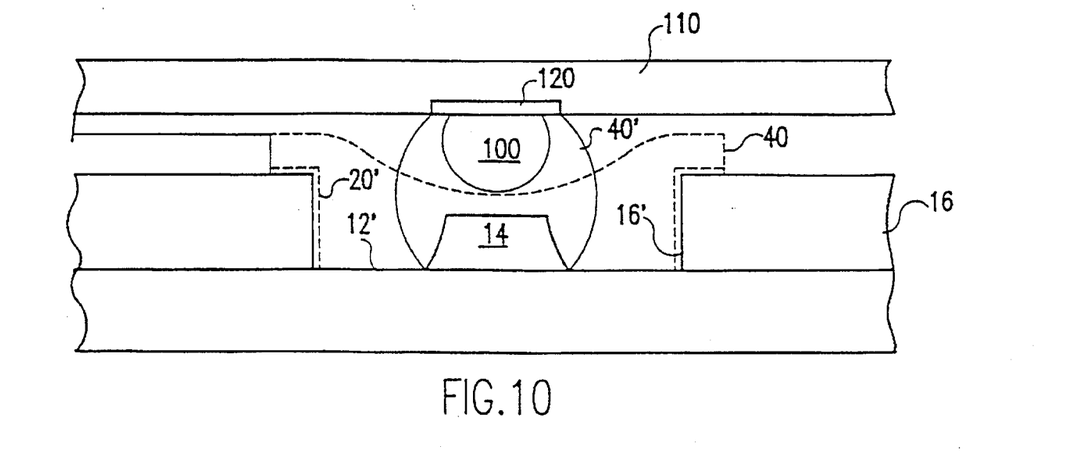
FIG. 10 is an illustration of a variant, advantageous geometry of solder deposit and connection which can be developed in accordance with the invention.

Another advantage of this variation of the invention is that in cases where the aperture 16' is significantly larger than pad or connection 14, as alluded to above, it is desirable for maximizing the amount of solder in the joint and minimization of parasitic capacitance of the joint that the solder pull back from both the sides 16' of the aperture in layer 16 and the surface 12' of layer or substrate 12 as shown in FIG. 10. Since the deposit of solder constituent material 20' has been substituted for the exposed portion of copper layer 20, when solder deposit 40 is reflowed, possibly while making a solder connection to pad or connection 120 of device 110 (with or without C4 preform 100), the solder constituent material is immediately incorporated into the deposited solder material, any trace amounts of copper are immediately dissolved in the solder material and the solder will immediately withdraw from unwettable surfaces 12', 16' of layers 12, 16 and assume a stable meniscus-like shape 40' only between wettable surfaces of pads or connections 14 and 120.

In view of the foregoing, it is seen that the methodology and apparatus of the invention can provide solder deposits of high uniformity both in volume and shape which are particularly suitable for closely spaced connections and feature sizes which can be formed at the present state of lithographic technology and in which the content of low-solubility materials in the solder connection may be controlled to the point of substantial elimination.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An electroplating apparatus including
    means for directing a flow of electroplating fluid generally perpendicular to a conductive layer, and
    means for oscillating said conductive layer in a direction generally perpendicular to said flow of electroplating fluid.

2. An electroplating apparatus as recited in claim 1, wherein said means for directing a flow of electroplating fluid comprises a plurality of jet orifices.

3. An electroplating apparatus as recited in claim 2, further including
    at least one fluid return aperture disposed between at least two of said plurality of jet orifices.

4. An electroplating apparatus as recited in claim 3, further including
    a source plenum means for supplying electroplating fluid to said plurality of jet orifices, and
    a return plenum for receiving electroplating fluid from said at least one fluid return aperture.

5. An electroplating apparatus as recited in claim 4, wherein said source plenum is adjacent said return plenum.

6. An electroplating apparatus as recited in claim 5, wherein said at least one return aperture comprises a tube extending through said source plenum.

* * * * *